(12) United States Patent
Yamaguchi

(10) Patent No.: US 6,642,604 B2
(45) Date of Patent: Nov. 4, 2003

(54) SEMICONDUCTOR DEVICE WITH RESISTOR LAYER HAVING HEAT RADIATION PATH TO SEMICONDUCTOR SUBSTRATE

(75) Inventor: Yasuo Yamaguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/208,993

(22) Filed: Aug. 1, 2002

(65) Prior Publication Data

US 2003/0052386 A1 Mar. 20, 2003

(30) Foreign Application Priority Data

Sep. 20, 2001 (JP) ........................................ 2001-286921

(51) Int. Cl.[7] .............................................. H01L 29/00
(52) U.S. Cl. ...................... 257/536; 257/537; 257/539; 257/542; 257/747; 257/767; 257/775; 438/382; 438/383; 438/384; 438/393; 438/399
(58) Field of Search ................................. 257/536, 537, 257/539, 542, 747, 767, 775; 438/382, 383, 384, 393, 399

(56) References Cited

U.S. PATENT DOCUMENTS

| | | | | | |
|---|---|---|---|---|---|
| 5,475,254 | A | * | 12/1995 | Takahashi | 257/536 |
| 5,760,477 | A | * | 6/1998 | Cronin | 257/767 |
| 5,963,831 | A | * | 10/1999 | Fu | 438/666 |
| 6,090,678 | A | * | 7/2000 | Maghsoudnia | 438/382 |
| 6,194,775 | B1 | * | 2/2001 | Usami | 257/536 |

* cited by examiner

Primary Examiner—Nathan J. Flynn
Assistant Examiner—Remmon R. Fordé
(74) Attorney, Agent, or Firm—Oblon, Spivak, McClelland, Maier & Neustadt, P.C.

(57) ABSTRACT

A resistor layer (5) is formed on an isolation insulating film (4) selectively formed in a major surface (1S) of a semiconductor substrate (1). An interlayer insulation film (7) covering the resistor layer (5) has first and second plugs (9, 19) buried therein in the form of buried interconnections. The first and second plugs (9, 19) provide connection not only between an end portion of the resistor layer (5) and first and second interconnection layers (8, 18) but also between the end portion of the resistor layer (5) and the major surface (1S) of the semiconductor substrate (1).

10 Claims, 8 Drawing Sheets

SEMICONDUCTOR DEVICE WITH RESISTOR LAYER HAVING HEAT RADIATION PATH TO SEMICONDUCTOR SUBSTRATE

BACKGROUND OF THE INVENTION

1. Field of the Invention

The present invention relates to a semiconductor device suitable for a semiconductor integrated circuit comprising MOSFETs (MOS field effect transistors) as its components, and more specifically to improvements in reduction in temperature rise in resistor elements while maintaining a high degree of integration.

2. Description of the Background Art

With the progress of miniaturization of semiconductor elements forming a semiconductor integrated circuit and improvements in the scale of integration of semiconductor integrated circuits, 1 Gbit dynamic memories and logic devices which can be equipped with 10 mega gates have recently been developed. It has also become possible to implement, on a single semiconductor chip, a system itself which had conventionally been built with a configuration of various kinds of LSIs (large integrated circuits) on a board held in a casing. That is the emergence of system LSIs.

In system LSIs, analog ICs and passive elements, which had conventionally been integrated on a board in the form of discrete elements, are taking on greater importance. Of the passive elements, especially resistor elements have remarkably increased in importance. However, with improvements in the scale of integration and miniaturization of resistor elements themselves, great attention is being given to the issue of heat radiation which was of no concern when the resistor elements were formed in relatively large dimensions with a low degree of integration.

Figure 14:
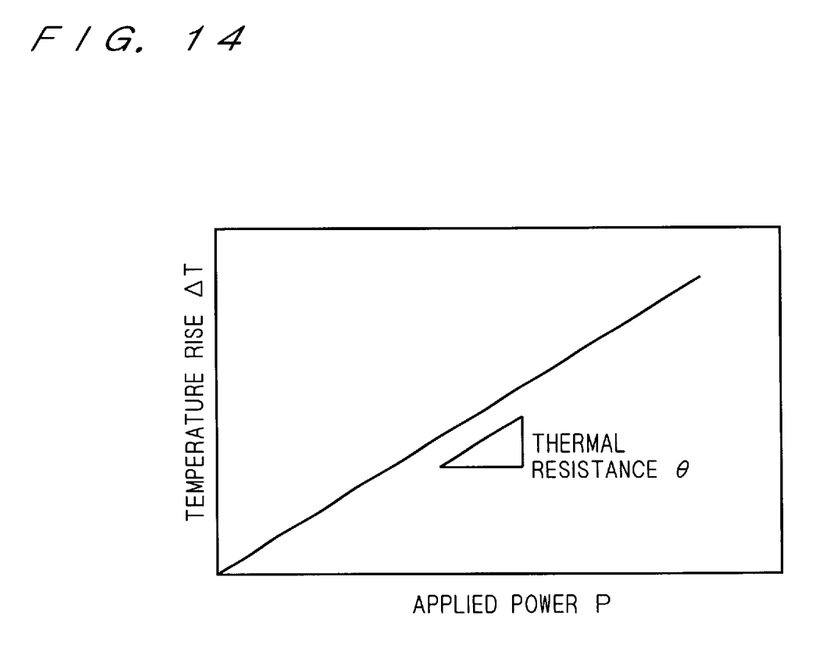
FIG. 14 is a graph for explaining a conventional problem.

As shown in the graph of FIG. 14, as the power applied to the resistor elements increases, the temperatures of the resistor elements rise because of Joule heat generated by the resistor elements. A gradient $\theta$ with respect to the relationship between the temperature rise $\Delta T$ and the applied power P is called thermal resistance. That is, the thermal resistance $\theta$ can be defined by the following equation (1):

$$\Delta T = \theta \cdot P \quad (1)$$

A resistor element formed on a silicon substrate of high thermal conductivity has a low thermal resistance $\theta$. Accordingly, a temperature rise in the resistor element formed on the silicon substrate can be minimized. However in a resistor element formed on an isolation insulating film (element isolation insulating film) which is formed on the major surface of a silicon substrate, a greater temperature rise will occur due to a high thermal resistance of the isolation insulating film generally having a thickness of approximately 200 to 400 nm.

Figure 15:
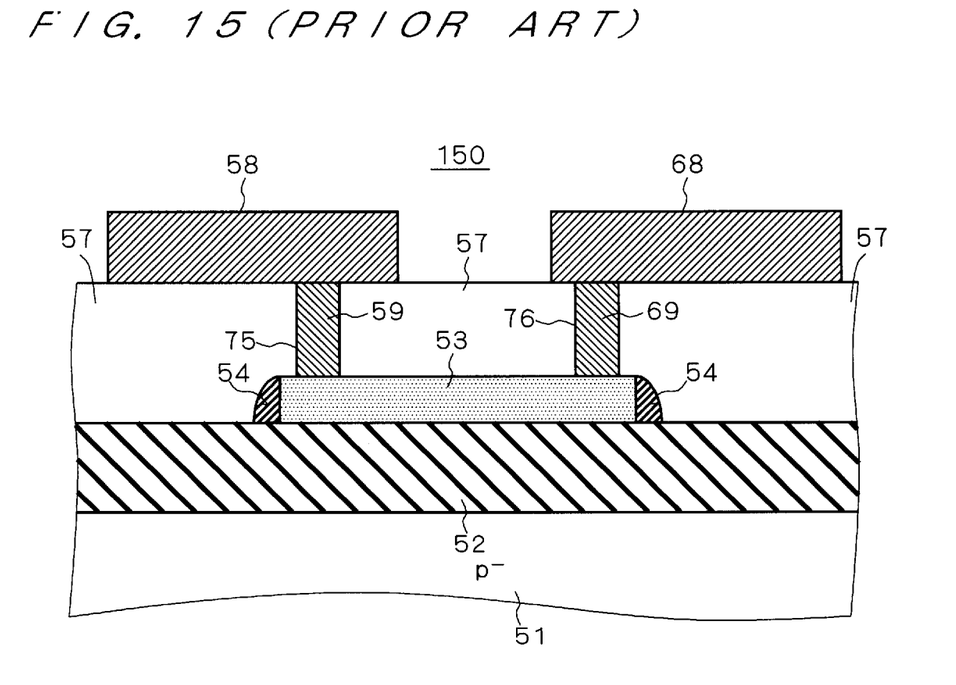
FIGS. 15 and 16 respectively are longitudinal and plan section views of a conventional device.
Figure 16:
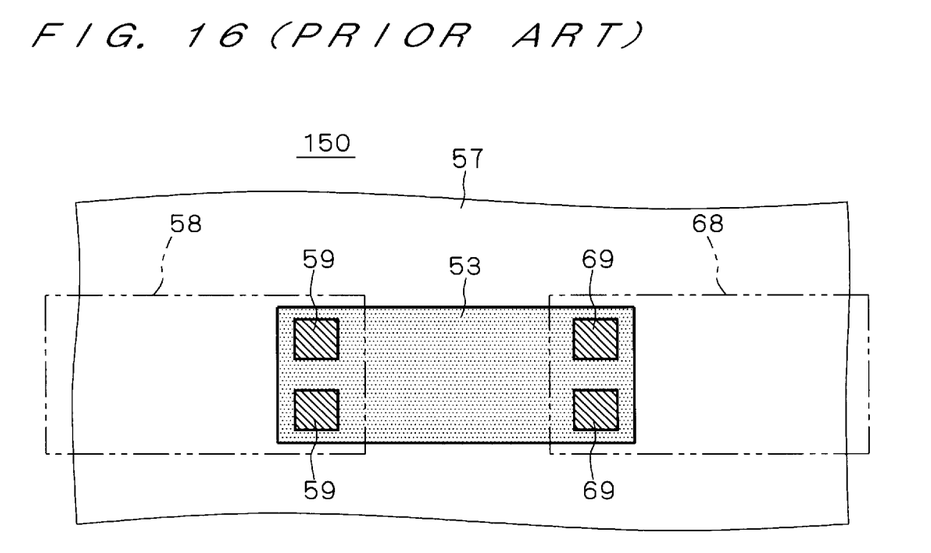

FIGS. 15 and 16 respectively are longitudinal and plan section views of a conventional semiconductor device with a resistor element. This device 150 comprises a semiconductor substrate 51, an isolation insulating film 52, a resistor layer 53, a sidewall spacer 54, an interlayer insulation film 57, plugs 59 and 69 and interconnection layers 58 and 68. The semiconductor substrate 51 is a silicon substrate, and the isolation insulating film 52 is selectively formed on the major surface of the semiconductor substrate 51. The resistor layer 53 formed on the isolation insulating film 52 as a resistor element is made of, for example, phosphorus-doped polysilicon. The interlayer insulation film 57 covers the semiconductor substrate 51, the isolation insulating film 52, the resistor layer 53 and the insulative sidewall spacer 54. The interconnection layers 58 and 68 disposed on the interlayer insulation film 57 are made of AlCu. The interlayer insulation film 57 has through holes 75 and 76 extending therethrough which are filled respectively with the conductive plugs 57 and 69, thereby providing electrical connections between the interconnection layers 58, 68 and the resistor layer 53. Tungsten is a major constituent of the plugs 59 and 69.

The diameters of the plugs 59 and 69, in general, are approximately equal to or approximately 1.5 times greater than the design rule for the semiconductor device 150, and the plugs 59 and 69 are generally circular in transverse cross section along the major surface of the semiconductor substrate 51. However, the cross-sectional shapes of the plugs 59 and 69, at the design stage, are set to have the shape of uniform squares as shown in FIG. 16 and thereafter rounded by the proximity effect of light on a semiconductor wafer to have a circular shape.

In the resistor layer 53 shown in FIGS. 15 and 16, as above described, the temperature rises with increasing applied power, exceeding a maximum operating temperature $Tj_{MAX}$. The maximum operating temperature $Tj_{MAX}$ is a maximum temperature that should not be exceeded in order to secure normal operation or reliability of the device. If the device is operated with a temperature exceeding the maximum operating temperature $Tj_{MAX}$, metallic atoms such as Al in the interconnection layers 58 and 68 can travel with current. This phenomenon, known as electromigration, may in some cases cause defects in the interconnection layers 58 and 68, thereby resulting in an open failure that no current flows. It may also promote degradation of a gate oxide film, thereby causing degradation in device reliability.

Conventionally, in order to prevent the temperature from exceeding the maximum operating temperature $Tj_{MAX}$, measures have been taken to increase an area of heat radiation while maintaining a constant resistance value by equally multiplying the width and length of the resistor layer 53. However, with the current progress to a higher level of semiconductor element miniaturization, system LSIs using a number of resistor layers cannot achieve a predetermined level of integration without reducing the area of the resistor layer 53. That is, there is a problem with the conventional semiconductor device that it cannot gain the benefit of chip cost reduction from scaling.

SUMMARY OF THE INVENTION

The present invention has been devised to solve the aforementioned conventional problems and an object thereof is to provide a semiconductor device capable of improving heat radiating characteristics without impairing miniaturization of resistor elements.

According to the present invention, the semiconductor device includes a semiconductor substrate, an isolation insulating film, a resistor layer, an interlayer insulation film, first and second interconnection layers, a first conductive plug, and a second conductive plug. The semiconductor substrate has a major surface. The isolation insulating film is selectively formed on the major surface and the resistor layer is formed on the isolation insulating film. The interlayer insulation film covers the semiconductor substrate, the isolation insulating film and the resistor layer. The first and second interconnection layers are disposed on the interlayer insulation film. The first conductive plug is selectively buried in the interlayer insulation film and has an upper end connected to the first interconnection layer and a lower end connected to one end of the resistor layer and a first portion of the major surface of the semiconductor substrate which is adjacent to the isolation insulating film. The first conductive plug is rectangular in cross section along the major surface with its long sides extending along a main direction to connect the one end and the other end of the resistor layer and its short sides extending along a direction orthogonal to the main direction. The second conductive plug is selectively buried in the interlayer insulation film and has an upper end connected to the second interconnection layer and a lower end connected to the other end of the resistor layer.

In the semiconductor device, heat generated in the resistor layer by current supplied through the first and second interconnection layers can efficiently be dissipated through the first conductive plug into the semiconductor substrate. This effectively reduces a temperature rise in the resistor layer without impairing miniaturization of the resistor layer. Besides, since the first conductive plug is rectangular in cross section with its long sides extending along the main direction of the resistor layer, a radiation path from the resistor layer to the semiconductor substrate can be secured by the first conductive plug which has stable filling properties with a reduction of a filling material.

These and other objects, features, aspects and advantages of the present invention will become more apparent from the following detailed description of the present invention when taken in conjunction with the accompanying drawings.

DESCRIPTION OF THE PREFERRED EMBODIMENTS

In the description of the present invention, the term "approximately" is taken to include an error in manufacture deviating from the design value.

First Preferred Embodiment (Device Configuration)

Figure 1:
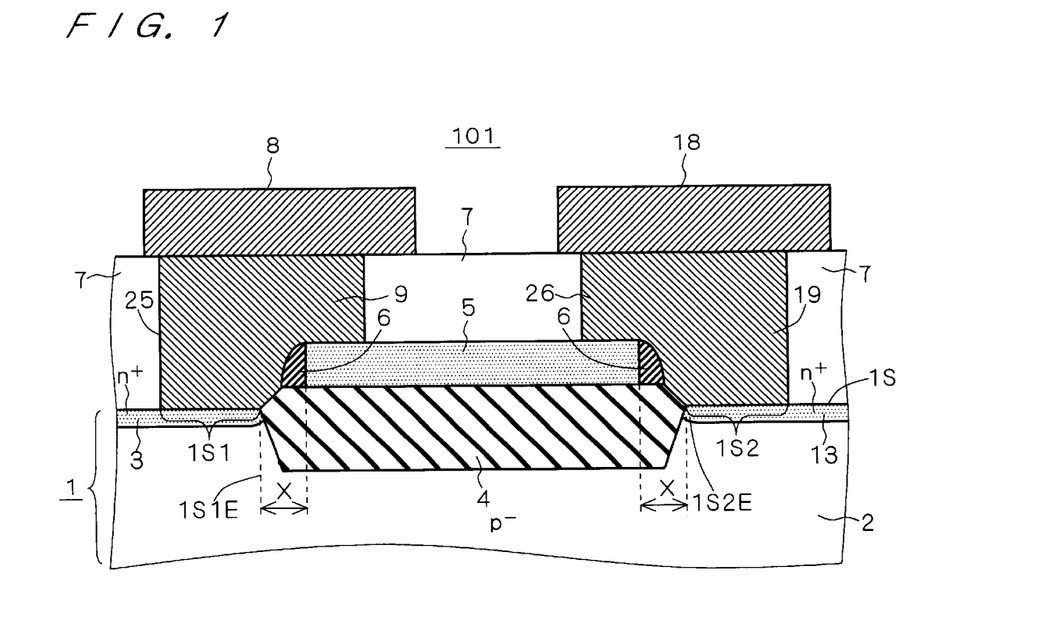
FIGS. 1 and 2 respectively are longitudinal and plan section views of a device according to a first preferred embodiment.
Figure 2:
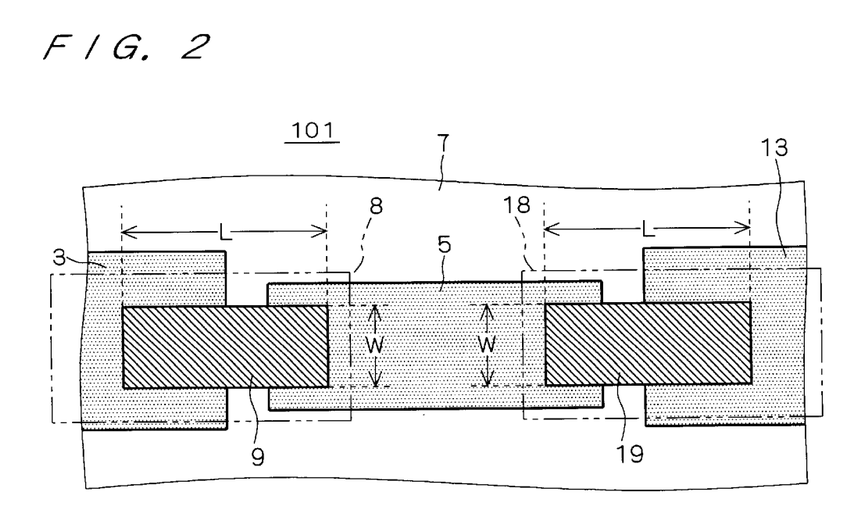

FIGS. 1 and 2 respectively are longitudinal and plan section views of a semiconductor device 101 according to a first preferred embodiment of the present invention. This semiconductor device 101 comprises a semiconductor substrate 1, an isolation insulating film 4, a resistor layer 5, a sidewall spacer 6, an interlayer insulation film 7, first and second plugs 9 and 19, and first and second interconnection layers 8 and 18. The semiconductor substrate 1 is, for example, a silicon substrate and includes a first semiconductor layer 2 of p⁻ type (first conductivity type) containing boron with a concentration of approximately $1\times10^{15}$ atoms/$cm^3$ as impurities, and second semiconductor layers 3 and 13 of n⁺ type (second conductivity type) selectively formed in a major surface 1S of the semiconductor substrate 1 (hereinafter, the first and second semiconductor layers 2, 3 and 13 are referred to simply as the semiconductor layers 2, 3 and 13). The semiconductor layers 3 and 13 may, for example, be semiconductor layers formed at the same time as source/drain regions of an MOSFET formed in the semiconductor substrate 1, or may be source/drain regions themselves. The semiconductor layer 2 and the semiconductor layers 3 and 13 form pn junctions therebetween. The isolation insulating film 4, which is an oxide film with a thickness of for example approximately 300 nm, is formed by filling, for example, a trench formed in the major surface 1S of the semiconductor substrate 1 with oxide film by high-density plasma (HDP) CVD.

The resistor layer 5 is formed as a resistor element on the isolation insulating film 4 and is made of, for example, phosphorus-doped polysilicon containing phosphorus with a concentration of between approximately $1\times10^{20}$ atoms/$cm^3$ and approximately $1\times10^{21}$ atoms/$cm^3$. This resistor layer 5 is formed by depositing doped polysilicon by LP-CVD at the same time as a gate electrode (not shown) during, for example, a MOS process for forming a MOS in the semiconductor substrate 1. In this case, the resistor layer 5 and the gate electrode are made of the same material. In formation of a MOSFET, generally an LDD (Lightly Doped Drain) structure or a source/drain extension structure is in many cases implemented by forming a sidewall spacer on the sidewall surfaces of the gate electrode. In that case, as shown in FIG. 1, the sidewall spacer 6 is also formed on the sidewall surfaces of end portions of the resistor layer 5.

To reduce resistance value, the resistor layer 5 may be of a polycide structure which is a multilayer structure containing high melting point silicide such as tungsten silicide or may be of a salicide structure which is formed by self-fusion reaction of a metal such as cobalt with the gate or source/drain regions. However, for simplicity, described herein is the case where the resistor layer 5 is made of doped polysilicon with which convenient, stable resistance of approximately 100 Ω/□ can be obtained.

The interlayer insulation film 7 covering the semiconductor substrate 1, the isolation insulating film 4, the resistor layer 5 and the sidewall spacer 6 has a thickness of approximately 500 nm to approximately 1 μm, for example. The interlayer insulation film 7, which is formed by for example an atmospheric pressure CVD or LP-CVD method, has a composite layer structure of non-doped oxide film and boron- and phosphorus-doped oxide film (BPSG). The first and second interconnection layers 8 and 18 deposited on the interlayer insulation film 7 are formed, for example, by depositing an AlCu layer of a thickness of approximately 200 nm to approximately 1 μm using generally a sputtering method and then patterning the resultant layer (hereinafter the first and second interconnection layers 8 and 18 are referred to simply as the interconnection layers 8 and 18).

The interlayer insulation film 7 has through holes 25 and 26 extending therethrough which are filled respectively with the first and second conductive plugs 9 and 19 (hereinafter the first and second plugs 9 and 19 are referred to simply as the plugs 9 and 19). That is, the plugs 9 and 19 are selectively buried in the interlayer insulation film 7. Preferably, tungsten with excellent coverage should be a major constituent of the plugs 9 and 19. The plug 9 is connected at its upper end to the interconnection layer 8 and at its lower end partly to one end of the resistor layer 5. Similarly, the plug 19 is connected at its upper end to the interconnection layer 18 and at its lower end partly to the other end (opposed to the above one end) of the resistor layer 5. This permits a supply of current via the interconnection layers 8 and 18 to the resistor layer 5.

As shown in FIG. 2, the plugs 9 and 19 each are rectangular in transverse cross section along the major surface 1S of the semiconductor substrate 1 (i.e., width W<length L) with their long sides extending along a main direction (horizontal direction in FIG. 2) to connect one and the other ends of the resistor layer 5 and their short sides extending along a direction orthogonal to the main direction. The plugs 9 and 19 extend outwardly of the resistor layer 5 and the isolation insulating film 4 so that their respective lower ends are also connected respectively to first and second portions 1S1 and 1S2 of the major surface 1S of the semiconductor substrate 1 which are adjacent to the isolation insulating film 4 (first and second connections 1S1 and 1S2).

In this fashion, the plugs 9 and 19 are formed not only as plugs for connecting the resistor layer 5 and the interconnection layers 8, 18 but also as interconnections for connecting the resistor layer 5 and the semiconductor substrate 1. Thereby Joule heat occurring in the resistor layer 5 will efficiently be dissipated through the plugs 9 and 19 into the semiconductor substrate 1. This effectively reduces a temperature rise in the resistor layer 5 without impairing miniaturization of the resistor layer 5.

The plug 9 and the major surface 1S of the semiconductor substrate 1 are connected to each other at a portion of the $n^+$ semiconductor layer 3 exposed to the major surface 1S; similarly, the plug 19 and the major surface 1S of the semiconductor substrate 1 are connected to each other at a portion of the $n^+$ semiconductor layer 13 exposed to the major surface 1S. Thus, a flow of leakage current between the resistor layer 5 and the semiconductor substrate 1 can be inhibited by applying 0 V or negative bias voltage to the $p^-$ semiconductor layer 2 and applying 0 V or positive bias voltage through the interconnection layers 8 and 18 to the resistor layer 5.

As shown in FIGS. 1 and 2, the resistor layer 5 is formed to have end portions in close proximity to the end portions of the isolation insulating film 4. Thereby Joule heat occurring in the resistor layer 5 can efficiently be dissipated into the semiconductor substrate 1. The connections 1S1 and 1S2 of the major surface 1S of the semiconductor substrate 1, which are respectively connected to the plugs 9 and 19, respectively have end portions 1S1E and 1S2E which are located on the side of the resistor layer 5. The design value of a distance X along the major surface 1S and between the end portion 1S1E or 1S2E and one or the other end of the resistor layer 5 should preferably be set to a value that can secure a minimum distance within a range determined in consideration of overlapping and deviations of dimensions in the manufacturing process. For example, the design value of the distance X should preferably be set to a value within the range of approximately one-half to approximately one times the design rules (corresponding to a minimum gate length) for the semiconductor device 101. At a 0.10-$\mu$m design rule, for example, the design value of the distance X should be set to a value within the range of approximately 0.05 $\mu$m to approximately 0.1 $\mu$m. Thereby the distance X in the finished semiconductor device 101 can be set to a value equal to or less than approximately the design rules.

Even if the distance X is set to equal to or less than approximately twice the thickness of the resistor layer 5 (i.e., the thickness of the gate electrode), a sufficiently good heat radiation effect can be obtained. Thus, the distance X may be so set under certain layout constraints.

(How to Form Plugs)

In the formation of the plugs 9 and 19, a well-known technique for forming tungsten buried interconnections which are larger than conventional tungsten plugs can be used. The tungsten buried interconnections are also called tungsten damascene interconnections and generally used as local interconnections for reducing cell areas of, for example, SRAMs (static RAMs).

Figure 3:
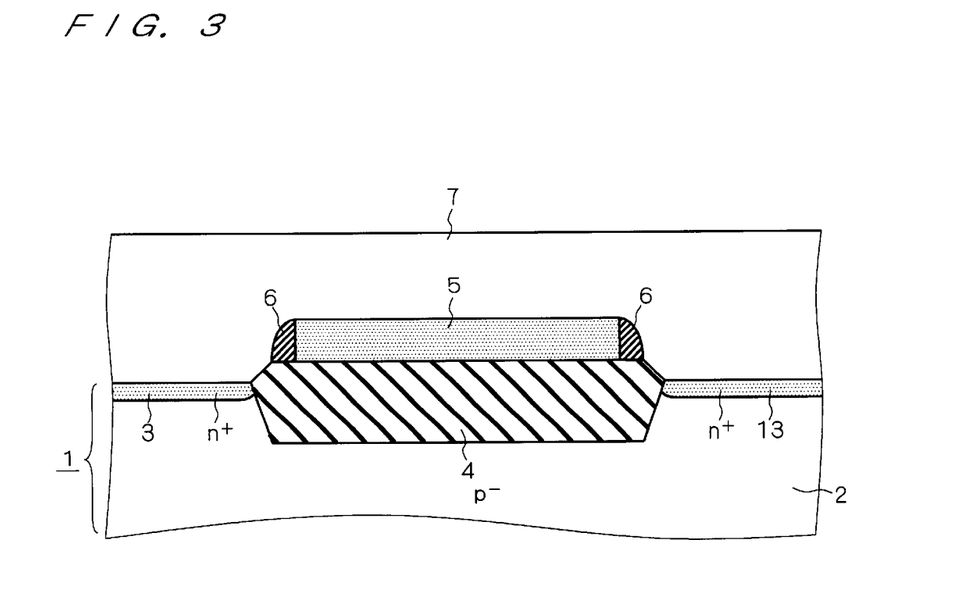
FIGS. 3 and 4 are diagrams illustrating the manufacturing process of the device according to the first preferred embodiment.
Figure 4:
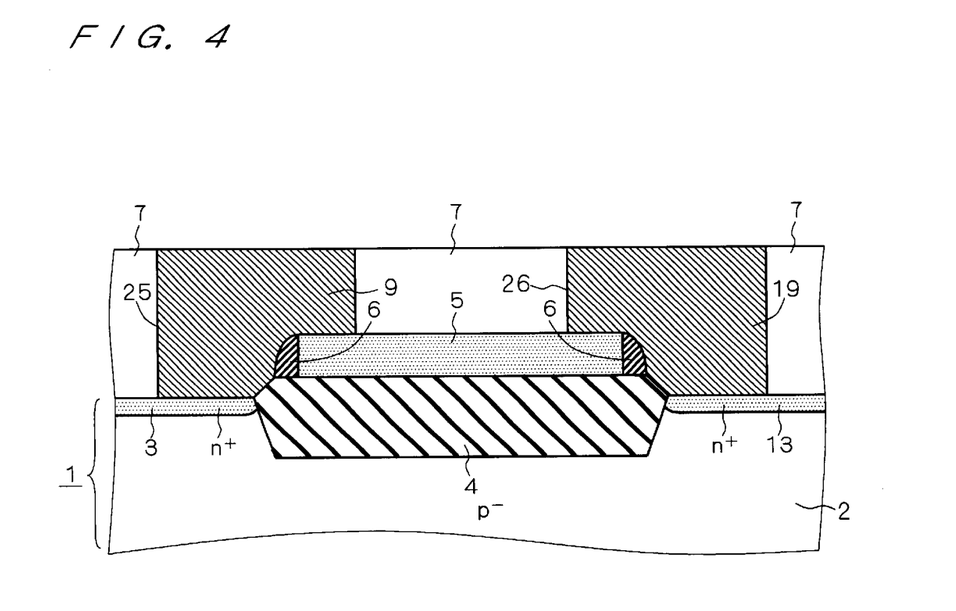

In order to form the plugs 9 and 19 as tungsten buried interconnections, the interlayer insulation film 7, as shown in FIG. 3, is first deposited to cover the semiconductor substrate (in this case, silicon substrate) 1, the isolation insulating film (in this case, isolation oxide film) 4, the resistor layer 5 and the sidewall spacer 6. Then, the step of FIG. 4 is performed. In the step of FIG. 4, the through holes 25 and 26 are first selectively formed in the interlayer insulation film 7 as trenches for formation of tungsten buried interconnections. The trenches are formed to extend to the major surface 1S (see FIG. 1) of the semiconductor substrate 1. Although not shown, it is desirable that, after the formation of the gate electrode and the source/drain regions, a silicon nitride film having a thickness of approximately 10 to 50 nm be deposited as a bottom layer of the interlayer insulation film 7. By so doing, the above trenches can be formed with stability without overetching the isolation insulating film 4 and the semiconductor substrate 1 which are base layers of the interlayer insulation film 7, since the etch rate of silicon nitride film is several to a dozen or so times lower than that of BPSG or silicon oxide film forming the interlayer insulation film 7.

Then, tungsten with a thickness of approximately 1 $\mu$m is deposited on the surface of the interlayer insulation film 7 to completely fill the through holes, i.e. trenches 25 and 26 and to cover the interlayer insulation film 7. For satisfactory filling of the trenches, the amount of tungsten to be deposited is determined in such a manner as to exceed the height of the trenches (the height of the interlayer insulation film 7). Since the through holes 25 and 26 are rectangular in transverse cross section (FIG. 2), the whole through holes 25 and 26 can easily be filled with a reduced amount of tungsten as a filling material. Then, an excess tungsten film deposited on the interlayer insulation film 7 is removed by CMP (Chemical Mechanical Polishing), whereby only tungsten in the trenches remains (FIG. 4 shows this state). The interconnection layers 8 and 18 are formed thereafter (FIG. 1).

While the buried interconnections, i.e. the plugs 9 and 19, made of tungsten have been described herein, they may be made of metals primarily composed of tungsten or other metals primarily composed of other elements such as copper. Further, although only the buried metal (e.g., tungsten or copper) as a major constituent of the buried interconnections have been described above, it is desirable to provide a barrier metal on the inner walls of the trenches. Such a barrier metal prevents chemical reactions between the semiconductor substrate 1 and the buried metal. For example, a TiN and Ti composite layer should be used as a barrier metal for a buried metal of tungsten, and a TaN layer or TaN and Ta composite layer for a buried metal of copper.

(Another Example)

Figure 5:
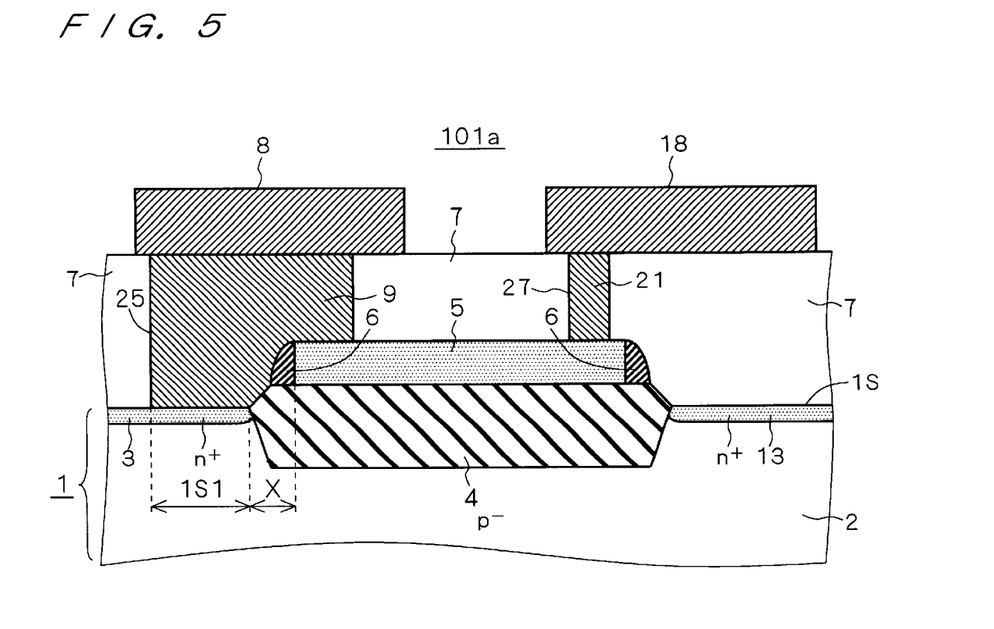
FIGS. 5 and 6 respectively are longitudinal and plan section views showing another example of the device according to the first preferred embodiment.
Figure 6:
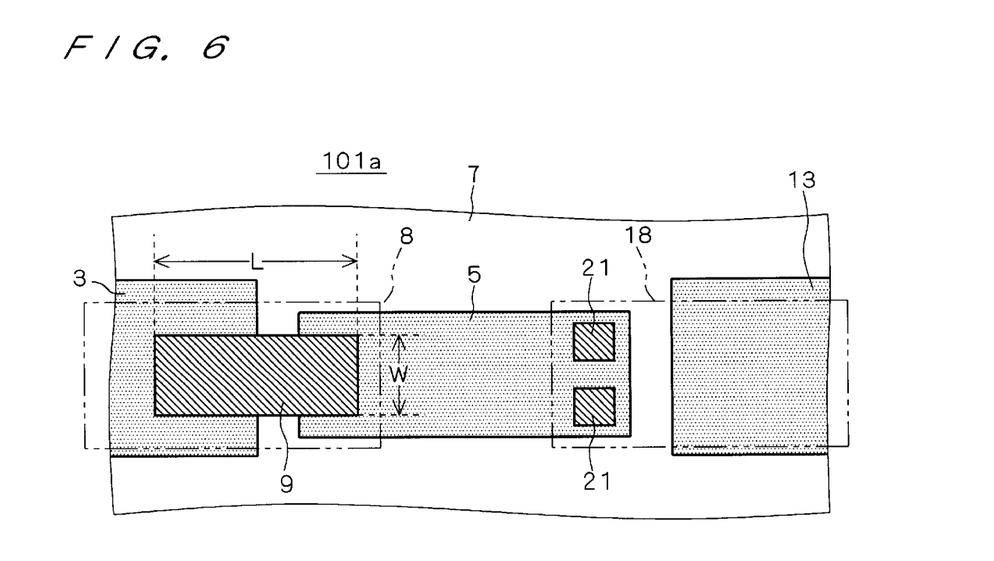

While, in the device 101 of FIG. 1, the resistor layer 5 has radiation paths to the semiconductor substrate 1 at both ends, even the resistor layer 5 having a radiation path at only one end can produce a heat radiation effect correspondingly. FIGS. 5 and 6 respectively are longitudinal and plan section views of a semiconductor device 101a in such a configuration. In the device 101a, a conductive plug 21 which fills a through hole 27 formed in the interlayer insulation film 7 connects the interconnection layer 18 only to the other end of the resistor layer 5 and not to the semiconductor substrate 1. That is, the through hole 27 and the plug 21 are configured similarly to the through hole 76 and the plug 69 in the conventional device 150 (FIGS. 15 and 16).

Second Preferred Embodiment

Figure 7:
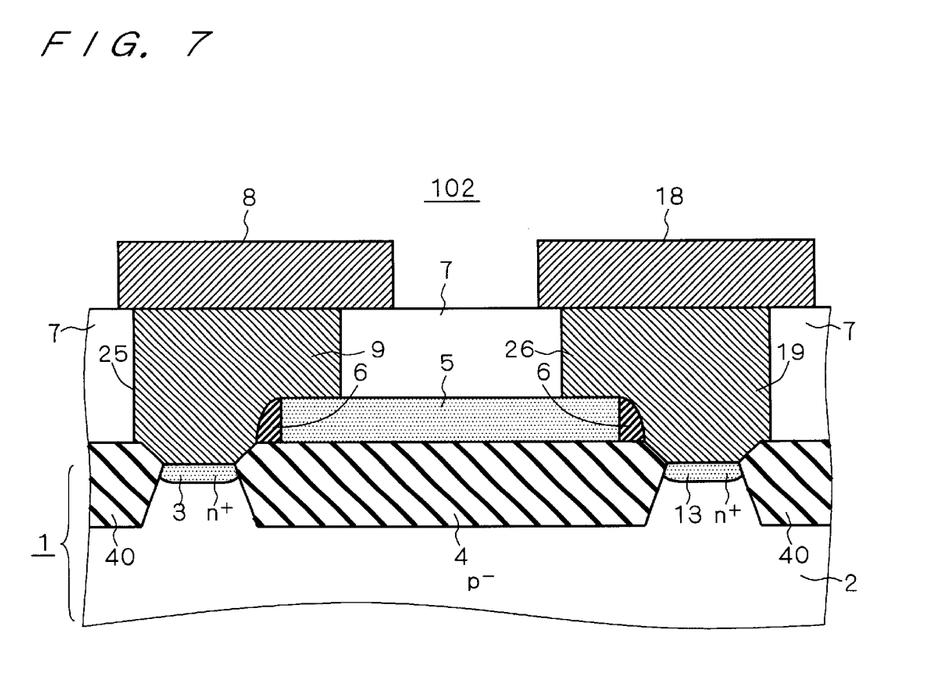
FIGS. 7 and 8 respectively are longitudinal and plan section views of a device according to a second preferred embodiment.
Figure 8:
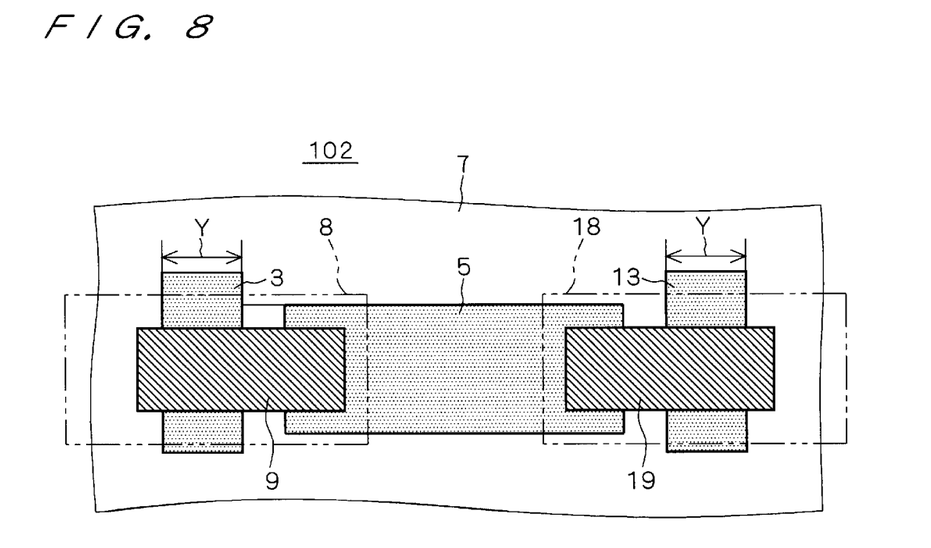

FIGS. 7 and 8 respectively are longitudinal and plan section views of a semiconductor device 102 according to a second preferred embodiment of the present invention. This semiconductor device 102 characteristically differs from the semiconductor device 101 (FIGS. 1 and 2) in that there is a limitation in the dimensions of the semiconductor layers 3 and 13 connected to the plugs 9 and 19. More specifically, in the device 102, the widths Y of the semiconductor layers 3 and 13 along the main direction of the resistor layer 5 are set to a value of the design rules for the semiconductor device 102, i.e., the minimum permissible width. In the example of FIG. 7, the proportion of the areas of the semiconductor layers 3 and 13 in the major surface of the semiconductor substrate 1 is defined by the isolation insulating films 4 and 40. The isolation insulating films 4 and 40, although shown as separate films in FIG. 7, are integrally coupled to each other to surround the semiconductor layers 3 and 13 as shown in FIG. 8.

Since in this way the widths Y of the semiconductor layers 3 and 13 are limited to the minimum permissible width, junction capacitances between the semiconductor layers 3, 13 and the semiconductor layer 2 can be minimized. This reduces the influence of junction capacitances over circuit performance.

Third Preferred Embodiment

Figure 9:
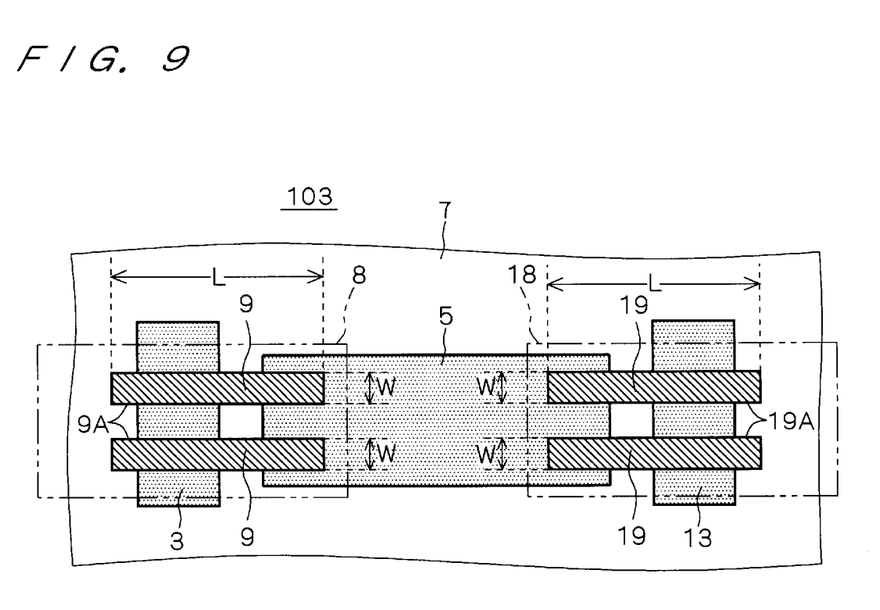
FIG. 9 is a plan section view of a device according to a third preferred embodiment.

FIG. 9 is a plan section view of a semiconductor device 103 according to a third preferred embodiment of the present invention. The longitudinal section view of the semiconductor device 103 is identical to that of FIG. 7. The device 103 comprises a plurality of plugs 9 and a plurality of plugs 19 which respectively are arranged in a direction orthogonal to the main direction of the resistor layer 5 (a vertical direction in FIG. 9). The plugs 9 and 19 each are rectangular in transverse cross section with their long sides extending along the main direction of the resistor layer 5. The design values of the short sides (width W) of the plugs 9 and 19 each are set to a value of the design rules. In this respect, the device 103 characteristically differs from the device 102 (FIGS. 7 and 8). In other words, the plugs 9 and 19 shown in FIG. 8 are divided respectively into a plurality of unit plugs 9A and a plurality of unit plugs 19A, and the widths W of the unit plugs 9A and 19A are standardized as a minimum interconnection width.

This allows, in the formation of the plugs 9A and 19A, a reduction in the thickness of the buried metal to be deposited, e.g., tungsten, thereby achieving the effect of cost reduction. At a 0.10-μm design rule, for example, the line width is approximately 0.15 μm; therefore, stable buried interconnections can be formed by setting the thickness of tungsten to be deposited at approximately 0.15 μm. Besides, by arranging the unit plugs as many as space allows, heat radiating characteristics can be improved. In this fashion, the device 103 can obtain the plugs 9 and 19 with stable filling properties while maintaining good heat radiating characteristics in areas ranging from the resistor layer 5 to the semiconductor substrate 1 and saving the material for the plugs 9 and 19.

Fourth Preferred Embodiment

Figure 10:
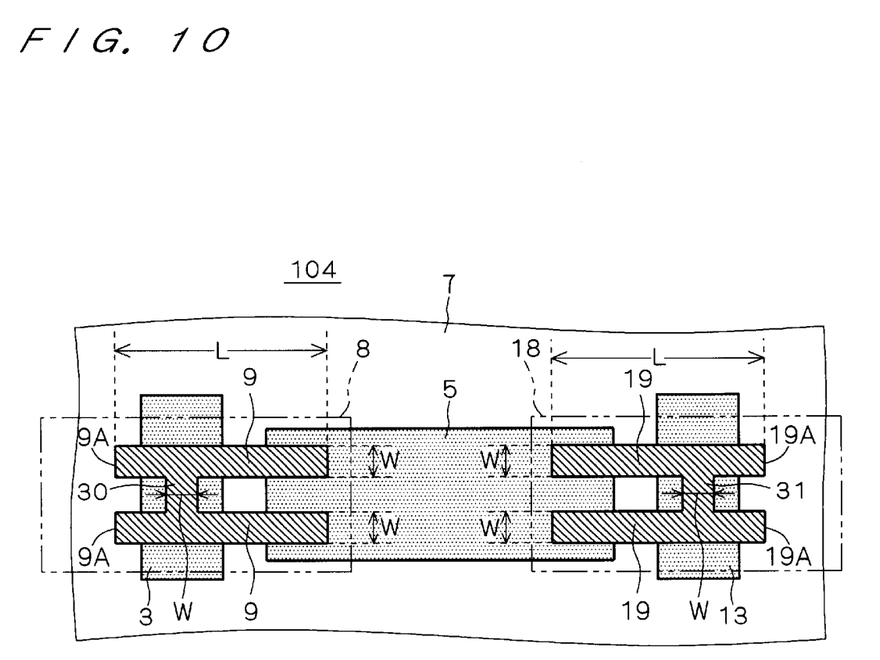
FIG. 10 is a plan section view of a device according to a fourth preferred embodiment.
Figure 11:
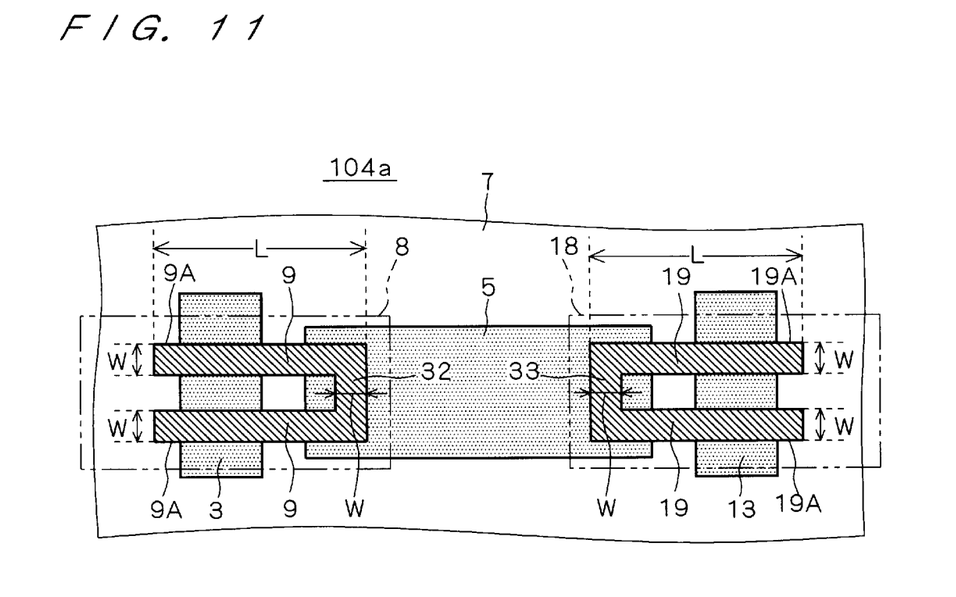
FIG. 11 is a plan section view showing another example of the device according to the fourth preferred embodiment.
Figure 12:
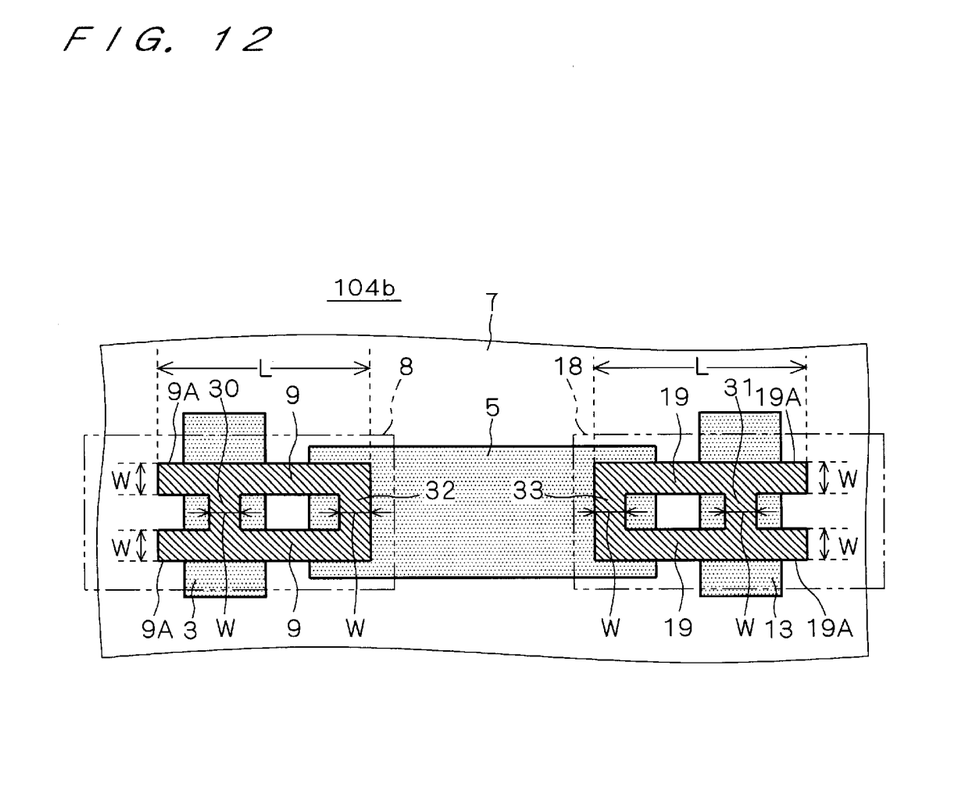
FIG. 12 is a plan section view showing still another example of the device according to the fourth preferred embodiment.

FIGS. 10 to 12 are plan section views of semiconductor devices 104, 104a and 104b, respectively, according to a fourth preferred embodiment of the present invention. The longitudinal section views of these semiconductor devices 104, 104a and 104b are identical to that of FIG. 7. The device 104 characteristically differs from the device 103 (FIG. 9) in that it comprises third conductive plugs 30 and 31. The device 104a characteristically differs from the device 103 (FIG. 9) in that it comprises fourth conductive plugs 32 and 33, and the device 104b characteristically differs from the device 103 (FIG. 9) in that it comprises the first to fourth plugs 30 to 33 (hereinafter the first to fourth plugs 30 to 33 are referred to simply as the plugs 30 to 33). The plugs 30 to 33 are all made of the same material as and formed at the same time as the plugs 9 and 19.

The plugs 30 to 33 are selectively buried in the interlayer insulation film 7 to couple the plurality of unit plugs 9A and 19A arranged in the direction orthogonal to the main direction of the resistor layer 5. The design values of the widths W of the plugs 30 to 33 along the main direction of the resistor layer 5 are set to a value of the design rules. The formation of the plugs 30 to 33, therefore, does not require an increase in the thickness of the buried metal to be deposited and thus, the effect of saving the buried metal is equivalent to that achieved by the device 103 (FIG. 9).

The plug 30 is connected at its upper end to the interconnection layer 8 and at its lower end to the semiconductor layer 3. The plug 31 is connected at its upper end to the interconnection layer 18 and at its lower end to the semiconductor layer 13. The plug 32 is connected at its upper end to the interconnection layer 8 and at its lower end to one end of the resistor layer 5. The plug 33 is connected at its upper end to the interconnection layer 18 and at its lower end to the other end of the resistor layer 5. These plugs 30 to 33, therefore, contribute greatly to increasing the contact area between the semiconductor substrate 1 and the plugs 9 and 19 or the contact area between the resistor layer 5 and the plugs 9 and 19. From this, the devices 104, 104a and 104b, as compared with the device 103, can expand the radiation paths from the resistor layer 5 to the semiconductor substrate 1, thereby further improving the heat radiating characteristics of the resistor layer 5.

Modification

Figure 13:
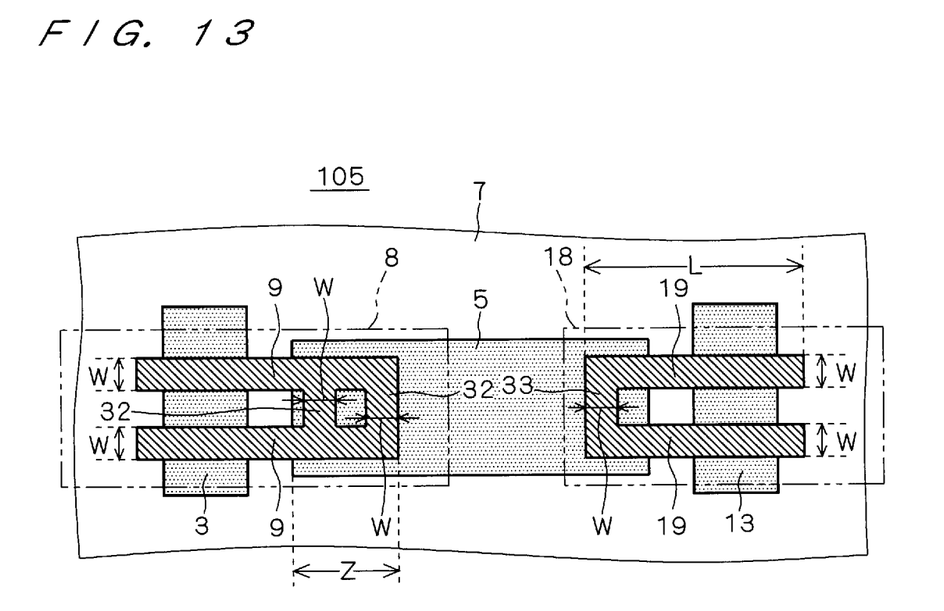
FIG. 13 is a plan section view of a device according to a modification.

While, in the aforementioned first through fourth preferred embodiments, one resistor element is formed of a single resistor layer 5, it is of course possible to form a single resistor element out of a plurality of separate resistor layers. It is also possible, as illustrated as a device 105 in the plan section view of FIG. 13, to extend a distance Z of a connection of at least one of the plugs 9 and 19 and the resistor layer 5 along the main direction of the resistor layer 5, inwardly to the resistor layer 5 to such an extent as to exceed the design rules for the device 105. This ensures a great contact area between the resistor layer 5 and at least one of the plugs 9 and 19, thereby further improving heat radiating characteristics. Further, by adjusting the distance Z in the manufacturing process of the device 105, the resistance of the resistor layer 5 can be adjusted to its design value in fine increments. In this case, the heat radiating characteristics can further be improved by providing one or more plugs 32 as illustrated in FIG. 13.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a semiconductor substrate having a major surface;
    an isolation insulating film selectively formed on said major surface;
    a resistor layer formed on said isolation insulating film;
    an interlayer insulation film covering said semiconductor substrate, said isolation insulating film and said resistor layer;
    first and second interconnection layers disposed on said interlayer insulation film;
    a first conductive plug selectively buried in said interlayer insulation film and having an upper end connected to said first interconnection layer and a lower end connected to one end of said resistor layer and a first portion of said major surface of said semiconductor substrate which is adjacent to said isolation insulating film,
    said first conductive plug being rectangular in cross section along said major surface with its long sides extending along a main direction to connect said one end and the other end of said resistor layer and its short sides extending along a direction orthogonal to said main direction; and
    a second conductive plug selectively buried in said interlayer insulation film and having an upper end connected to said second interconnection layer and a lower end connected to said other end of said resistor layer.

2. The semiconductor device according to claim 1, wherein
    said lower end of said second conductive plug is also connected to a second portion of said major surface of said semiconductor substrate which is adjacent to said isolation insulating film, said second portion being opposite to said first portion through said isolation insulting film, and
    said second conductive plug is rectangular in cross section along said major surface with its long sides extending along said main direction of said resistor layer and its short sides extending along said direction orthogonal to said main direction.

3. The semiconductor device according to claim 1, wherein
    a distance along said major surface and between one end of a connection of said first conductive plug and said major surface which is in contact with said isolation insulating film, and said one end of said resistor layer is set to equal to or less than approximately a value of a design rule for said semiconductor device.

4. The semiconductor device according to claim 1, wherein
    a distance along said major surface and between one end of a connection of said first conductive plug and said major surface which is in contact with said isolation insulating film, and said one end of said resistor layer is set to equal to or less than approximately twice a thickness of said resistor layer.

5. The semiconductor device according to claim 1, wherein
    said semiconductor substrate comprises a first semiconductor layer of a first conductivity type and a second semiconductor layer of a second conductivity type selectively formed on said major surface, said first and second semiconductor layers forming a pn junction therebetween, and
    said lower end of said first conductive plug is connected to said second semiconductor layer.

6. The semiconductor device according to claim 5, wherein
    a width of said second semiconductor layer along said main direction of said resistor layer is set to approximately a value of a design rule for said semiconductor device.

7. The semiconductor device according to claim 1, wherein
    said first conductive plug is divided into a plurality of unit plugs arranged in said direction orthogonal to said main direction of said resistor layer,
    said plurality of unit plugs each are rectangular in cross section along said major surface with their long sides extending along said main direction of said resistor layer and their short sides extending along said direction orthogonal to said main direction, a length of said short sides being set to approximately a value of a design rule for said semiconductor device.

8. The semiconductor device according to claim 7, further comprising:
    a third conductive plug selectively buried in said interlayer insulation film to couple said plurality of unit plugs which are arranged in said direction orthogonal to said main direction of said resistor layer, and having an upper end connected to said first interconnection layer and a lower end connected to said first portion of said major surface of said semiconductor substrate which is adjacent to said isolation insulating film,
    a width of said third conductive plug along said main direction being set to approximately a value of said design rule.

9. The semiconductor device according to claim 7, further comprising:
    a fourth conductive plug selectively buried in said interlayer insulation film to couple said plurality of unit plugs which are arranged in said direction orthogonal to said main direction of said resistor layer, and having an upper end connected to said first interconnection layer and a lower end connected to said one end of said resistor layer,
    a width of said fourth conductive layer along said main direction being set to approximately a value of said design rule.

10. The semiconductor device according to claim 1, wherein
    a distance of a connection of said first conductive plug and said resistor layer along said main direction is set to more than approximately a value of a design rule for said semiconductor device.

* * * * *